United States Patent
Lee et al.

(10) Patent No.: US 11,405,011 B2
(45) Date of Patent: Aug. 2, 2022

(54) METHODS AND APPARATUSES FOR SELECTIVE COMMUNICATION BETWEEN TAG AND READER USING FILTER

(71) Applicant: RESEARCH & BUSINESS FOUNDATION SUNGKYUNKWAN UNIVERSITY, Suwon-si (KR)

(72) Inventors: Tae-Jin Lee, Suwon-si (KR); Kyoung Min Kim, Seoul (KR); Young Il Cho, Daejeon (KR)

(73) Assignee: Research & Business Foundation Sungkyunkwan University, Suwon-si (KR)

(*) Notice: Subject to any disclaimer, the term of this patent is extended or adjusted under 35 U.S.C. 154(b) by 334 days.

(21) Appl. No.: 16/697,337

(22) Filed: Nov. 27, 2019

(65) Prior Publication Data
US 2020/0212867 A1    Jul. 2, 2020

(30) Foreign Application Priority Data
Dec. 27, 2018    (KR) .................. 10-2018-0170761

(51) Int. Cl.
| H03H 7/09 | (2006.01) |
| H04W 4/80 | (2018.01) |
| H04W 4/70 | (2018.01) |
| G06K 7/10 | (2006.01) |
| G06K 19/07 | (2006.01) |

(52) U.S. Cl.
CPC .......... *H03H 7/09* (2013.01); *G06K 7/10366* (2013.01); *G06K 19/0723* (2013.01)

(58) Field of Classification Search
CPC ........................................................ H03H 7/09
See application file for complete search history.

(56) References Cited

U.S. PATENT DOCUMENTS

| 10,628,639 B1* | 4/2020 | Lai ................... G01R 31/08 |
| 2006/0044115 A1* | 3/2006 | Doi ................... G06K 19/0723 |
| | | 340/10.42 |

(Continued)

FOREIGN PATENT DOCUMENTS

| KR | 10-2013-0042222 A | 4/2013 |
| KR | 10-1754025 B1 | 7/2017 |

OTHER PUBLICATIONS

Cho, Youngil et al., "Efficient Traffic Control Using Hash Function Filter for Massive IoT Computational RFID Communications", *Proceedings of the 2017 International Conference on Information Technology*. Dec. 27-29, 2017 (9 pages in English).

(Continued)

*Primary Examiner* — Joseph H Feild
*Assistant Examiner* — Pameshanand Mahase
(74) *Attorney, Agent, or Firm* — NSIP Law

(57) ABSTRACT

The present disclosure relates to a method and apparatus for selective communication between a tag and a reader using a filter. According to an embodiment of the present disclosure, a communication method between a tag and a reader using a filter performed by a reader includes generating a filter based on tag information of the tag to collect data, transmitting the generated filter to the tag, and receiving data from a tag that selected through a filtering operation of the transmitted filter.

16 Claims, 15 Drawing Sheets

(56) References Cited

U.S. PATENT DOCUMENTS

| | | | |
|---|---|---|---|
| 2006/0220790 A1* | 10/2006 | Doi .................... | G06K 7/0008 340/10.2 |
| 2008/0231449 A1* | 9/2008 | Moshfeghi ............ | G08C 17/02 340/572.1 |
| 2013/0110794 A1* | 5/2013 | Lee ...................... | G06F 16/215 707/692 |
| 2017/0316235 A1* | 11/2017 | Lee .................... | G06K 19/0723 |

OTHER PUBLICATIONS

Korean Office Action dated Aug. 23, 2019 in counterpart Korean Patent Application No. 10-2018-0170761 (7 pages in Korean).

* cited by examiner

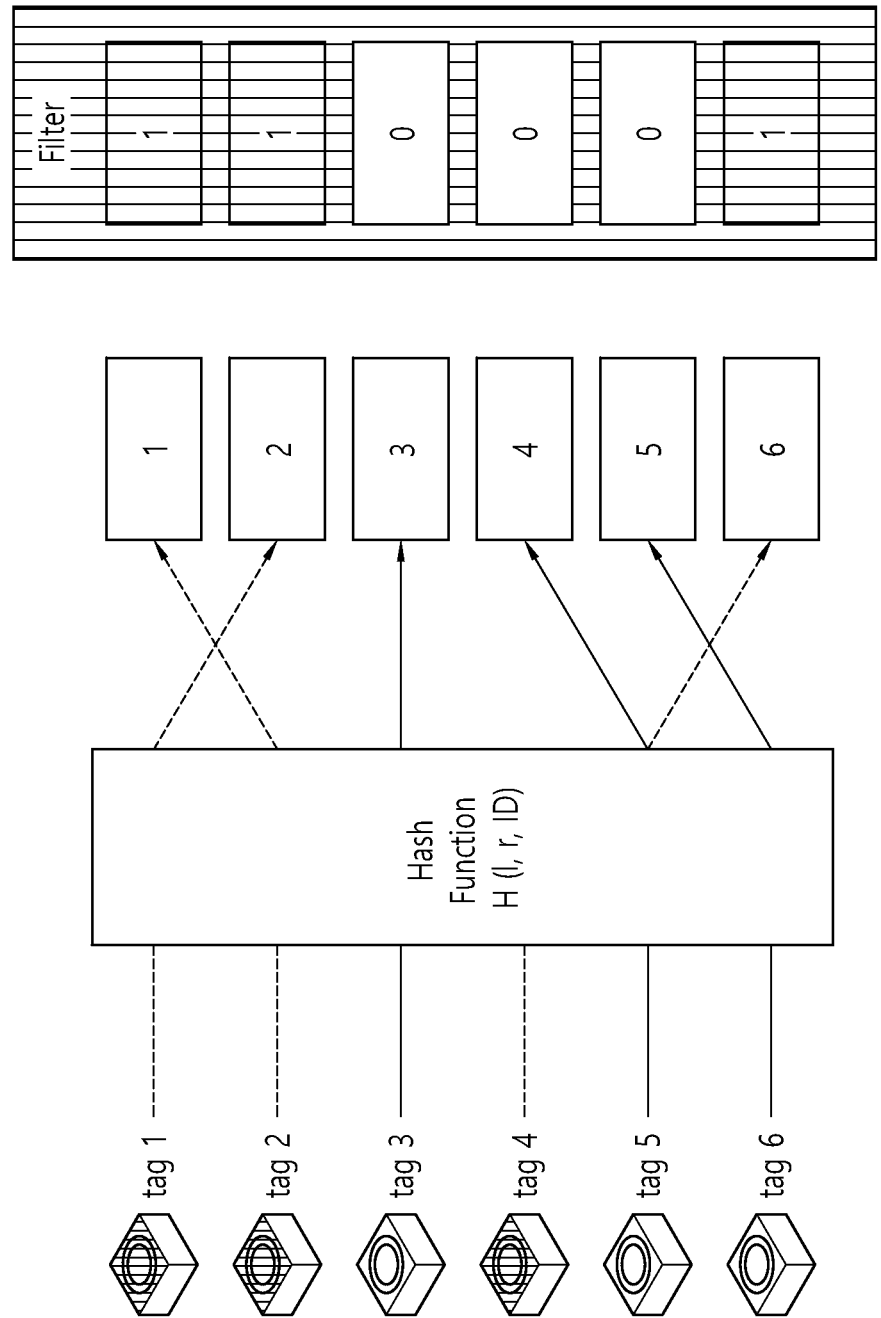

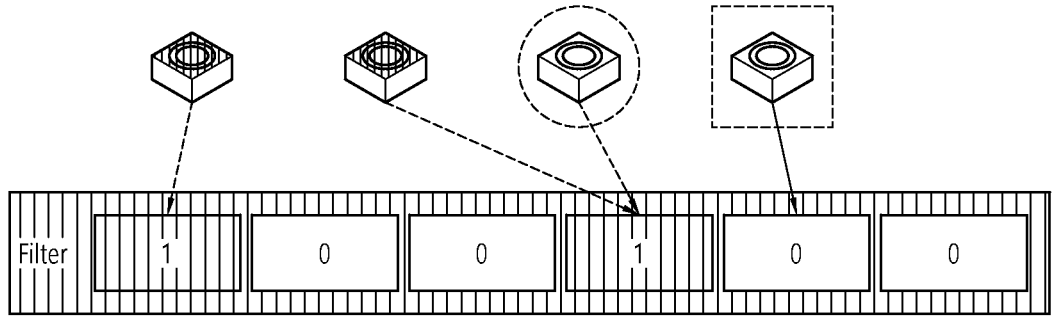
FIG. 5A
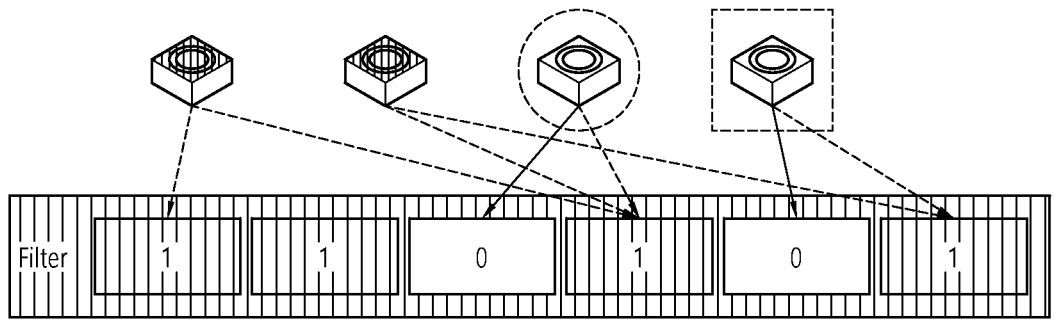
FIG. 5B
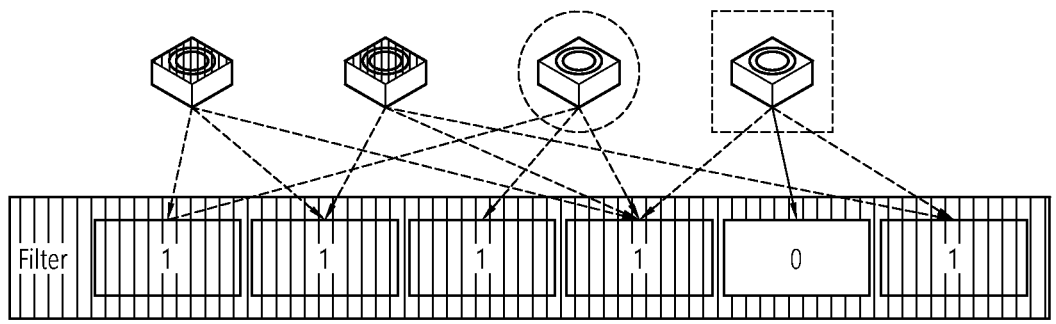
 : Specific Tag     : Filtered Tag     : Filtered Error Tag
FIG. 5C

METHODS AND APPARATUSES FOR SELECTIVE COMMUNICATION BETWEEN TAG AND READER USING FILTER

CROSS-REFERENCE TO RELATED APPLICATIONS

This application claims priority to Korean Patent Application No. 10-2018-0170761 filed on Dec. 27, 2018 in Korea, the entire contents of which are hereby incorporated by reference in their entirety.

BACKGROUND

1. Technical Field

The present disclosure relates to a method and apparatus for selective communication between a tag and a reader using a filter.

2. Description of Related Art

A tag in the conventional RFID communication transmits its own identification (ID) only according to a query which is a data transmission request of a reader. Recently, various sensors are attached to Radio-Frequency identification (RFID) tag, and it has been developed a Computational RFID (CRFID) to which energy harvesting and computation functions are added. Owing to this, the CRFID which may perform various things, data and process functions draw attention as one of core device of future Internet of Things (IoT).

In the conventional RFID communication technique, when a reader transmits a query message to collect information of tags, all the tags that receive it transmit data to the reader. The Collision phenomenon that two or more tags transmit data to the reader is an important problem that degrades the performance of an RFID system such as use efficiency degradation of channel and energy, increase of delay time, and the like. Many Media Access Control (MAC) methods have been researched to control such a Collision phenomenon. There is a central control type scheme in which a reader designates directly all tags and determines whether to transmit data. The central control type scheme is not proper for an IoT network environment in which many terminals are disposed since much overhead is required for designating directly load increase of a processing unit for transmission scheduling and many tags. Dynamic Frame Slotted Aloha (DFSA) protocol, which is a distributed type Media Access Control method, is a protocol based on Time Division Multiple Access (TDMA) in which tags selects autonomously a random Time-slot in a predetermined frame size informed by a reader and transmits data. The reader estimates the number of tags that attempt to transmit data at a start of a frame for every data transmission, configures an optimal frame size, and collect data of the tag, which is repeated until data transmissions of all tags are completed.

In the conventional RFID, since a reader needs to collect information of all RFID tags and the number of tags is not so great, the Media Access Control method has been frequently used. However, in a massive IoT network environment including CRFID tag, since the number of tags is great and the tags are not required to receive sensing information of all CRFID tags, it is not proper to apply the conventional DFSA protocol without any change. When a reader uses the conventional DFSA Media Access Control method to collect information of a specific CRFID tag, according to a data transmission request of the reader, all tags attempt data transmission contention. Accordingly, there is a problem that channel resource is wasted owing to the data transmission contention of unwanted tags, and owing to this, throughput is decreased, and delay time is increased.

SUMMARY

Exemplary embodiments of the present disclosure are to provide a method and apparatus for selective communication between a tag and a reader using a filter, in a network environment that a reader collects data of a tag (e.g., CRFID tag) and transmits it to a server according to the request of the server (e.g., IoT management server), in which the reader may selectively collect only the data of specific tag requested by the server.

Exemplary embodiments of the present disclosure are also to provide a method and apparatus for selective communication between a tag and a reader using a filter, in which a tag receives a filter (e.g., hash function filter) having a property of returning a unique index from a reader and determines whether to transmit data using the received filter.

Exemplary embodiments of the present disclosure are also to provide a method and apparatus for selective communication between a tag and a reader using a filter, to compensate the phenomenon that unwanted tag may pass a filter in the case that the filter is generated using a single hash function, which can minimize a filtering error by generating a filter using a plurality of hash functions.

According to one example embodiment of the present disclosure, it is provided a communication method between a tag and a reader using a filter performed by a reader including generating a filter based on tag information of the tag to collect data; transmitting the generated filter to the tag; and receiving data from a tag that selected through a filtering operation of the transmitted filter.

The step of generating a filter may include generating the filter using at least one hash function.

The step of generating a filter may include determining filter generation information required for generating the filter based on tag information to collect, and generating the filter using the tag information and the determined filter generation information.

The step of generating a filter may include determining the filter generation information including a filter length, a random-number generation seed and a number of hash functions.

The step of receiving data may include estimating a number of remaining tags that do not transmit data based on a number of slots in which collision occurs.

Meanwhile, according to another embodiment of the present disclosure, it is provided a communication method between a tag and a reader using a filter performed by a tag including receiving a filter from a reader; checking whether to pass through the filter based on the received filter and its own tag ID; and when passing through the filter, transmitting data to the reader.

The method may further include operating in a sleep mode when failing to pass the received filter.

The step of checking whether to pass through the filter may include transforming its own tag ID to an index value and checking whether to pass through the filter according to a position value corresponding to the transformed index value in the received filter.

The step of checking whether to pass through the filter may include transforming its own tag ID to an index value and check whether to pass through the filter according to at least one position value corresponding to the transformed at least one index value in the received filter.

The step of transmitting data may include selecting a transport slot randomly within a frame length and transmitting data to the selected transport slot.

Meanwhile, according to another example embodiment of the present disclosure, it is provided a reader for a selective communication between a tag and a reader using a filter including a communication module configured to communicate with a tag; a memory configured to store at least one command; a processor connected to the communication module and the memory, by executing at least one command, wherein the processor configured to: generate a filter based on tag information of the tag to collect data; transmit the generated filter to the tag; and receive data from a tag that selected through a filtering operation of the transmitted filter.

The processor may generate the filter using at least one hash function.

The processor may determine filter generation information required for generating the filter based on tag information to collect and generate the filter using the tag information and the determined filter generation information.

The processor may determine the filter generation information including a filter length, a random-number generation seed and the number of hash functions.

The processor may estimate the number of remaining tags that do not transmit data based on the number of slots in which collision occurs.

Meanwhile, according to another embodiment of the present disclosure, it is provided a tag for a selective communication between a tag and a reader using a filter including a communication module configured to communicate with a reader; a memory configured to store at least one command; a sensing module configured to sense data; a processor connected to the communication module, the memory and the sensing module, by executing at least one command, wherein the processor configured to: receive a filter from a reader; check whether to pass through the filter based on the received filter and its own tag ID; and when passing through the filter, transmit data to the reader.

The processor may operate in a sleep mode when failing to pass the received filter.

The processor may transform its own tag ID to an index value and check whether to pass through the filter according to a position value corresponding to the transformed index value in the received filter.

The processor may transform its own tag ID to an index value and check whether to pass through the filter according to at least one position value corresponding to the transformed at least one index value in the received filter.

The processor may select a transport slot randomly within a frame length and transmit data to the selected transport slot through the communication module.

According to exemplary embodiments of the present disclosure, when a reader collects data of a tag (e.g., CRFID tags), only information of required tags may be collected without overhead of the central control scheme.

Through this, according to exemplary embodiments of the present disclosure, energy of tags that do not participate in data transmission contention can be efficiently utilized in comparison with the technique applied to the conventional RFID system.

According to exemplary embodiments of the present disclosure, a channel use efficiency for data transmission can be increased by about 30%, and further, a time for collecting information of all tags can be decreased by about 40%.

BRIEF DESCRIPTION OF THE DRAWINGS

FIG. 4 is a diagram for describing an example of a process for a reader to generate a filter according to an embodiment of the present disclosure.

FIGS. 5A-5C are diagrams for describing examples of an operation for a reader that generates a filter using a plurality of hash functions.

DETAILED DESCRIPTION OF EXAMPLE EMBODIMENTS OF THE INVENTION

Figure 1:
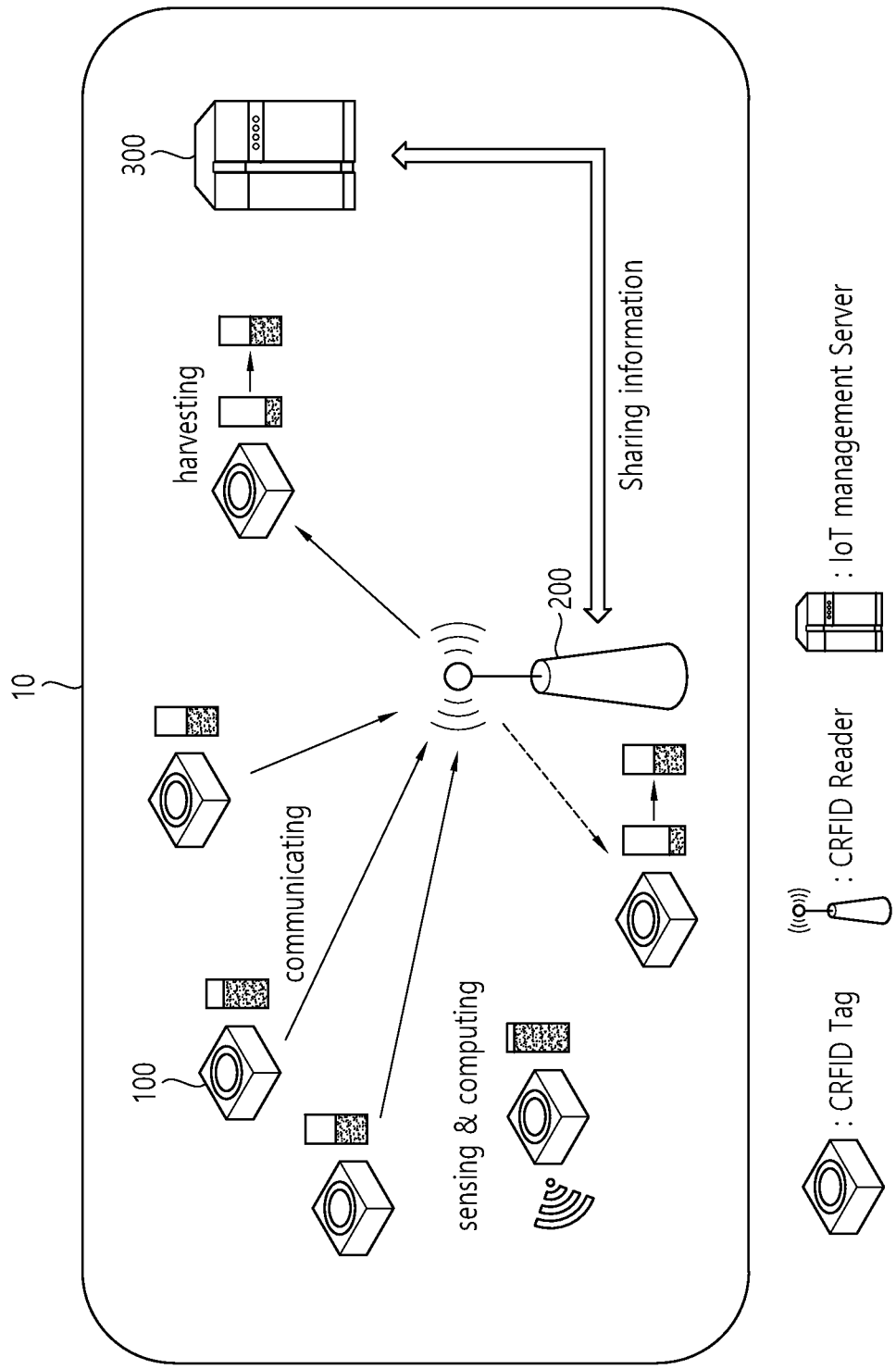
FIG. 1 is a diagram for describing IoT network environment to which an embodiment of the present disclosure is applied.

The present disclosure may have various modifications and various embodiments and specific embodiments will be illustrated in the drawings and described in detail in the detailed description.

However, this does not limit the present disclosure to specific embodiments, and it is understood that the present disclosure covers all the modifications, equivalents and replacements included within the idea and technical scope of the present disclosure.

Terms including as first, second, and the like are used for describing various constituent elements, but the constituent elements are not limited by the terms. The terms are used only to discriminate one constituent element from another component. For example, a first component may be referred to as a second component, and similarly, the second component may be referred to as the first component without departing from the scope of the present disclosure. A term 'and/or' includes a combination of a plurality of associated disclosed items or any item of the plurality of associated disclosed items.

When it is described that a component is "connected to" or "accesses" another component, the component may be directly connected to or access the other component, or a third component may be present there between. In contrast, it is understood that, when it is described that an element is "directly connected to" or "directly access" another element, it is understood that no element is present between the element and another element.

Terms used in the present application are used only to describe specific embodiments and are not intended to limit the present disclosure. A singular form may include a plural form if there is no clearly opposite meaning in the context. In the present application, it should be understood that term "include" or "have" indicates that a feature, a number, a step, an operation, a component, a part or the combination thereof described in the specification is present, but does not exclude a possibility of presence or addition of one or more other features, numbers, steps, operations, components, parts or combinations thereof, in advance.

Unless it is contrarily defined, all terms used herein including technological or scientific terms have the same meanings as those generally understood by a person with ordinary skill in the art. Terms which are defined in a generally used dictionary should be interpreted to have the same meaning as the meaning in the context of the related art and are not interpreted as an ideal meaning or excessively formal meanings unless clearly defined in the present application.

Hereinafter, preferred embodiments of the present disclosure will be described in detail with reference to the accompanying drawings and in describing the preferred embodiments with reference to the accompanying drawings, the same reference numeral will refer to the same or corresponding component regardless of the reference numeral and a duplicated description thereof will be omitted.

FIG. 1 is a diagram for describing IoT network environment to which an embodiment of the present disclosure is applied.

As shown in FIG. 1, in heavy traffic massive IoT network 10, CRFID tags 100 are congested massively, collect various IoT information such as a temperature, a humidity, a pressure, an intensity of light, and the like, and transmit data to CRFID reader 200. FIG. 1 shows a configuration example of the IoT network 10 including CRFID tags 100. Each of tags 100 performs functions of energy harvesting, sensing and computing, and communication. The reader collects information from the tag 100 according to a request of an IoT management Server 300 and transmits information desired by the IoT management Server 300 selectively.

It is assumed that the IoT network 10 to which an embodiment of the present disclosure is applied includes the IoT management Server 300, the reader 200 that performs a communication with the IoT management Server 300 and collects sensing data of the tag 100 and a plurality of CRFID tags 100 that collect information from various sensors in the tag. The IoT management Server 300 present in an exterior network may be connected to the reader 200 in wired and wireless manner. The Server 300 informs data type to collect and unique IDs of the CRFID tags for collecting the corresponding data to the reader 200. The reader 200 performs the role of collecting the information requested by the Server 300 from the tag 100 and forwarding it to the Server 300. The reader 200 is located at the center of the network 10 and collects information of a plurality of CRFID tags 100 which is uniformly disposed with the reader 200 at the center.

Figure 2:
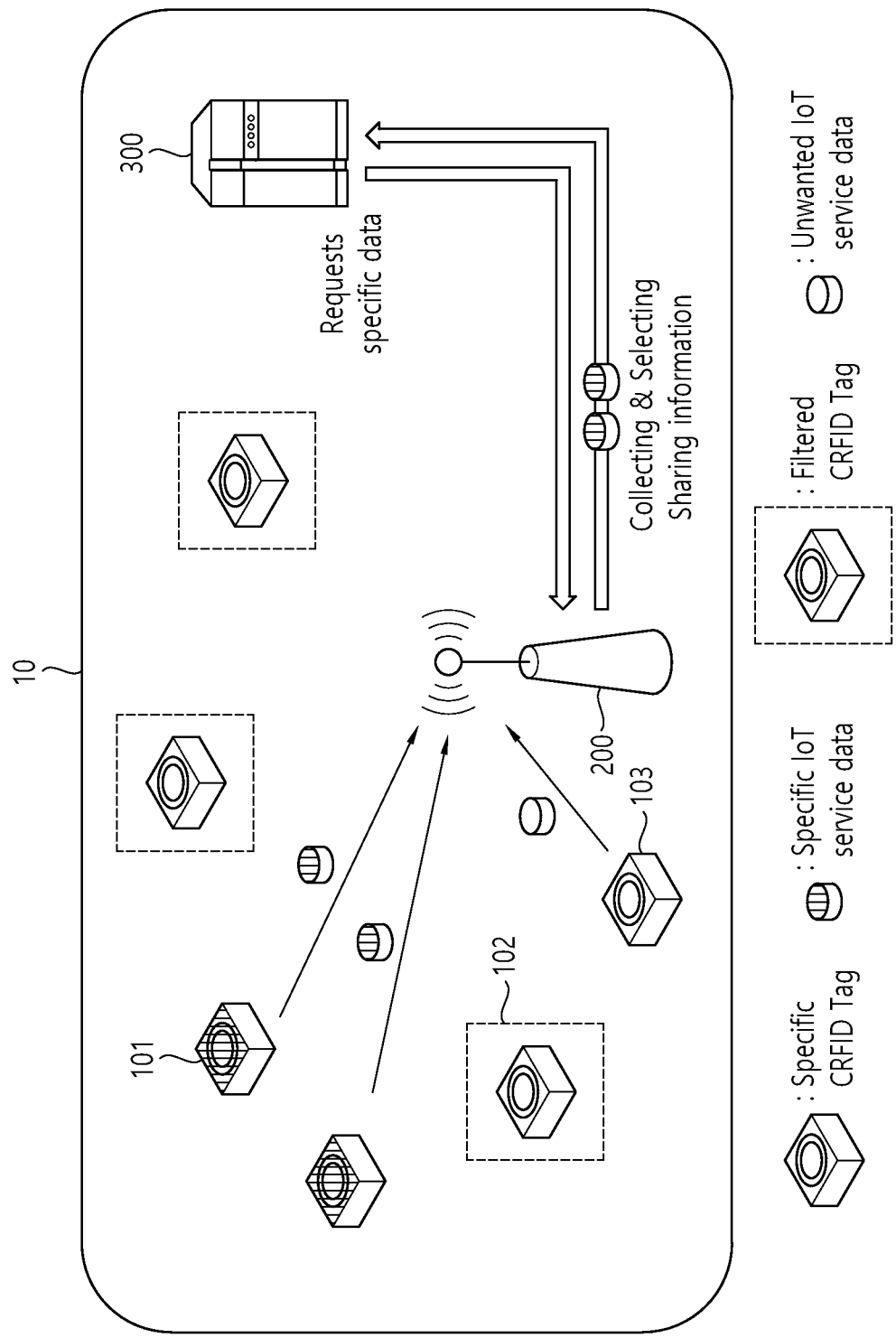
FIG. 2 is a diagram for describing a selective data collection process between a tag and a reader in the IoT network environment to which an embodiment of the present disclosure is applied.

FIG. 2 is a diagram for describing a selective data collection process between a tag and a reader in the IoT network environment to which an embodiment of the present disclosure is applied.

An embodiment of the present disclosure relates to a network environment in which the reader 200 collects information of the CRFID tag 100 according to the request of the IoT management Server 300 and transmits it to the IoT management Server 300. The reader 200 may selectively collect only the data of specific CRFID tags 101 requested by the IoT management Server 300.

For this, in an embodiment of the present disclosure, a hash function is used. A hash filter function in an embodiment of the present disclosure has the property of returning a unique index. Through the filter transmitted by the reader 200, the CRFID tags 101, 102 and 103 that receive it may determine whether it is available to transmit. As shown in FIG. 2, a specific CRFID tag 101 among the CRFID tags 101, 102 and 103 that receive the filter may transmit Specific IoT service data to the reader 200 through the filter. On the other hand, the filtered CRFID tag 102 that fails to pass the filter does not transmit data to the reader 200. Here, an unwanted tag 103 may pass the filter and transmit unwanted IoT service data to the reader 200. To compensate the problem that an unwanted tag passes a filter in the case that the filter is generated using a single hash function, the embodiments of the present disclosure may minimize a filtering error by generating a filter using a plurality of hash functions.

The embodiments of the present disclosure may be divided into a phase for the reader 200 generates a filter for collecting data requested by the IoT management Server 300, a phase for the reader 200 transmits the generated filter information to the CRFID tags 101, 102 and 103 and the CRFID tags 101, 102 and 103 acknowledge whether the data is transmitted through the filter, and a phase for the CRFID tags 101, 102 and 103 transmit data to the reader 200.

Before the reader 200 collects data, the reader 200 generates a filter based on a unique identification (ID) of the tag, a length of hash function filter and random-number generation seed information. To generate a filter, the IoT management Server 300 transmits unique IDs of the CRFID tags 101, 102 and 103 to collect data and the total number of tags in a network to the reader 200. The reader 200 that identifies the corresponding information determines a length of the hash function filter according to the total number of tags. Later, the reader 200 determines a random-number generation seed value and transforms a unique ID of each tag to a specific index value. In this case, as the length of the generated filter is short, the overhead of the filter generation and transmission is decreased. However, in the case that the length of filter is shorter than the number of tags 101, 102 and 103, since the ID of each tag does not have a unique value, the probability that unwanted CRFID tag 103 passes the filter increases. Accordingly, the length of filter needs to be determined to be equal to or greater than the total number of tags.

Figure 3:
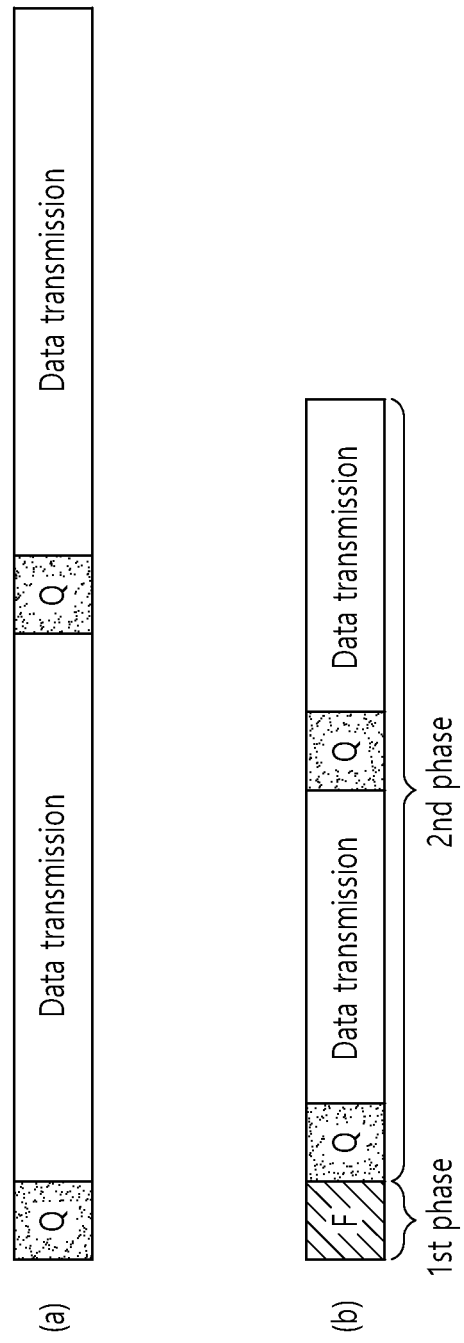
FIG. 3 is a diagram for describing data transmission process according to an embodiment of the conventional art and the present disclosure.

FIG. 3 is a diagram for describing data transmission process according to an embodiment of the conventional art and the present disclosure.

The conventional data transmission process includes a part that the reader transmits a query message to the CRFID tags and a part that the CRFID tags transmits data to the reader.

On the contrary, in an embodiment of the present disclosure, the data transmission process is divided into two steps including a first phase and a second phase. The data transmission process includes a first phase that the reader 200 identifies IDs of specific CRFID tags, generates a filter and transmits the filter to the tags according to a request of the IoT management server 300 and a second phase that the tags receiving the filter determine whether to transmit and transmit data by participating a data transmission contention.

As such, the data collection according to an embodiment of the present disclosure is divided into two phases. The first phase is a phase of generating a filter and identifying whether to perform filtering of the tag by a specific data request of the IoT management server 300, and the second phase is a data transmission phase of the tags that pass through the filter. In the phase of generating a filter and identifying whether to perform filtering of the tag, the reader 200 computes the unique ID owned by the tag to a specific index through the hash function and makes filter based on it. The reader 200 may transmit the filter to the tags, and each of the tags that receives it may compare the index computed through its own unique ID with the index of filter and identify whether to transmit data. In the data transmission step, only the tags that selected through a filtering operation of the filter transmit data to the reader, and the tag that does not transmit data is switched to a sleep mode in the corresponding phase. According to an embodiment of the present disclosure, a delay time may be decreased as well as the channel resource and energy use efficiency are improved in the CRFID IoT network environment.

FIG. 4 is a diagram for describing an example of a process for a reader to generate a filter according to an embodiment of the present disclosure.

In an embodiment of the present disclosure, the hash function H for a filter receives an input of a length l of filter, a random-number generation seed r and a unique ID of tag and returns an index in a uniform distribution within the length of filter. Using a plurality of random-number generation seeds, several indexes may be returned for an ID of a tag, and accordingly, an error that may occur in a single hash function is controlled.

FIG. 4 shows an example for the reader to generate a filter. For example, a wireless network includes 6 tags, and the IoT management server 300 forwards unique ID information of tag 1, tag 2 and tag 4 to the reader 200 to collect data of tag 1, tag 2 and tag 4. The reader 200 determines the length of filter to 6 bits based on the total number of tags in a network and transform the unique IDs of tags 1, 2 and 4 to index values through the hash function. When the unique ID of tag is transformed to an index value i, the $i^{th}$ bit of the filter is set to 1. Through this, the reader 200 generates the filter based on the result of collecting the index values of tags 1, 2 and 4. Tags 1, 2 and 4 that receive the filter transform their own unique IDs to index values with the received length of filter and random-number generation seed value and determines whether to transmit and receive data based on the filter information.

In a network including massive tags, in the case that the reader 200 set the length of tag to equal to or greater than the number of tags for a normal operation of the filter, the performance may be degraded owing to the overhead occurred for generating and transmitting the filter. In this case, the reader 200 uses a plurality of hash functions to generate the filter, and the probability that an unwanted tag transmits data through the filter is decreased when the length of filter is smaller than the number of tags.

FIGS. 5A-5C are diagrams for describing examples of an operation for a reader which generates a filter using a plurality of hash functions according to an embodiment of the present disclosure.

In the case that a filter is generated using N hash functions, the reader 200 generates N random-number generation seeds and transforms unique IDs of tags into N index values for each seed. Accordingly, when the number of total tags is T, the reader generates a filter by collecting NT index values. The tag that receives the filter transmits data only in the case that all the N index values generated with their own unique IDs utilizing N seed values are identical to those of the filter, but in the case that even one of them is not identical, the tag dos not transmits data.

Accordingly, when a plurality of hash functions is used rather than a single hash function is used, the probability that unintended tag passes through a filter may be decreased. FIG. 5A shows an example of using a single hash function, and FIG. 5B and FIG. 5C show examples of the cases that the number of hash functions is 2 and 3, respectively. However, in the case that too many hash functions are used, most of values of a filter becomes 1 and the filter is unable to not perform a normal role. Accordingly, the reader 200 needs to determine a proper number of hash functions used for generating a filter according to the total number of tags and the length of filter.

A ratio of the number $T_{unintended}$ of unintended tags that pass through a filter and transmit data and the number $T_{intended}$ of tags to collect is defined as Equation 1 below as a performance indicator EC-ration.

$$EC\text{-ratio} = \frac{T_{unintended}}{T_{intended}} \quad \text{[Equation 1]}$$

Figure 6:
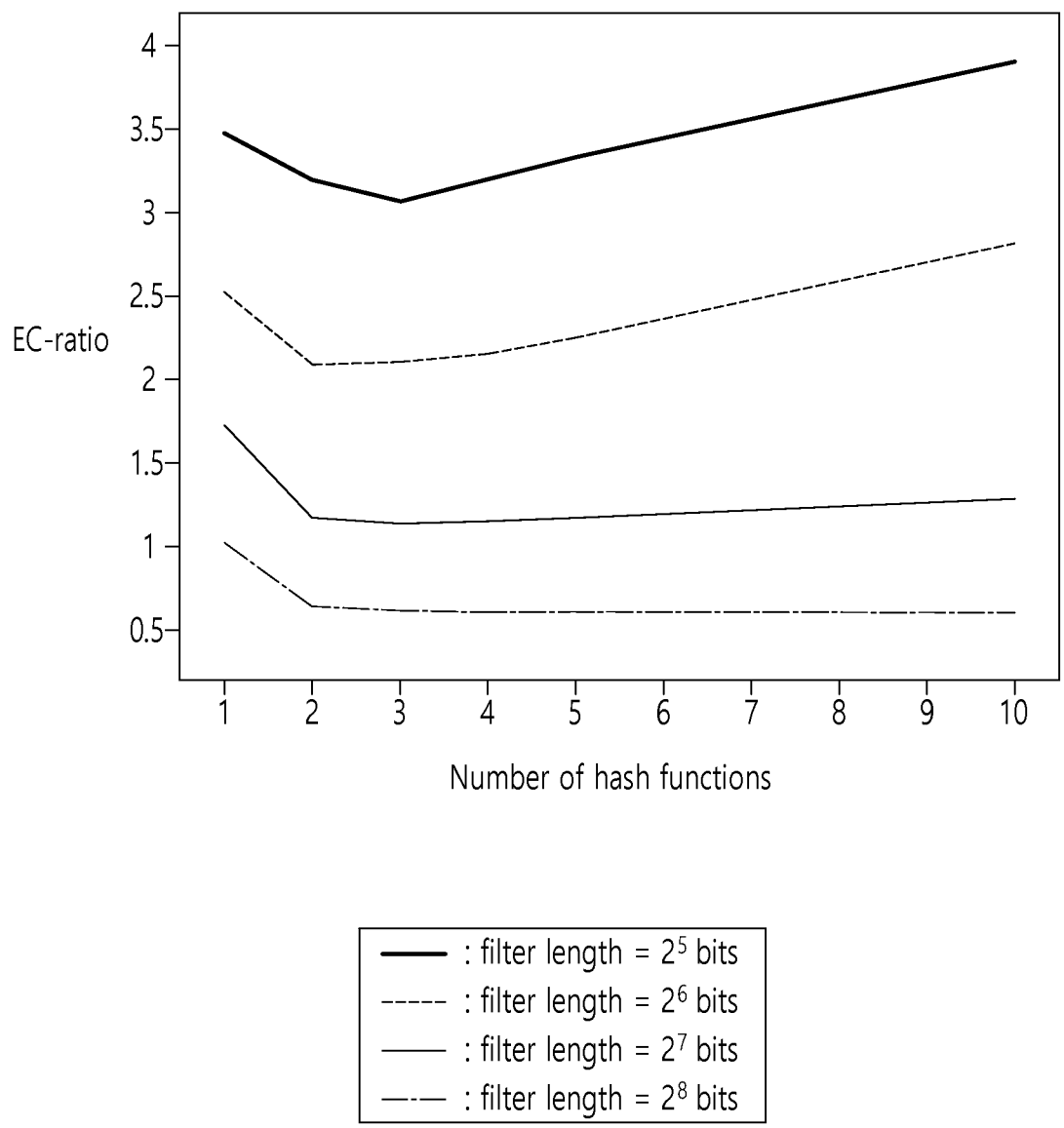
FIG. 6 is a diagram for describing a relation between the number of hash functions used for generating a filter and EC-ratio according to an embodiment of the present disclosure.

FIG. 6 is a diagram for describing a relation between the number of hash functions used for generating a filter and EC-ratio according to an embodiment of the present disclosure.

FIG. 6 is a graph showing a relation between the number of hash functions used for generating a filter and EC-ratio while the length of filter is changed to $2^5$, $2^6$, $2^7$ and $2^8$. At this time, the total number of tags in a network is 100, and a ratio ϕ of a tag intended to collect data in the entire tags. In the graph, as EC-ratio, which is the performance indicator, is small, which means that data transmission rate of the unintended tag is low. Since the number $T_{unintended}$ tags is small as the length of filter is increased, a small EC-ratio value is output, and it is identified that a small EC-ratio value is output when two or three hash functions are used for generating the filter.

Figure 7:
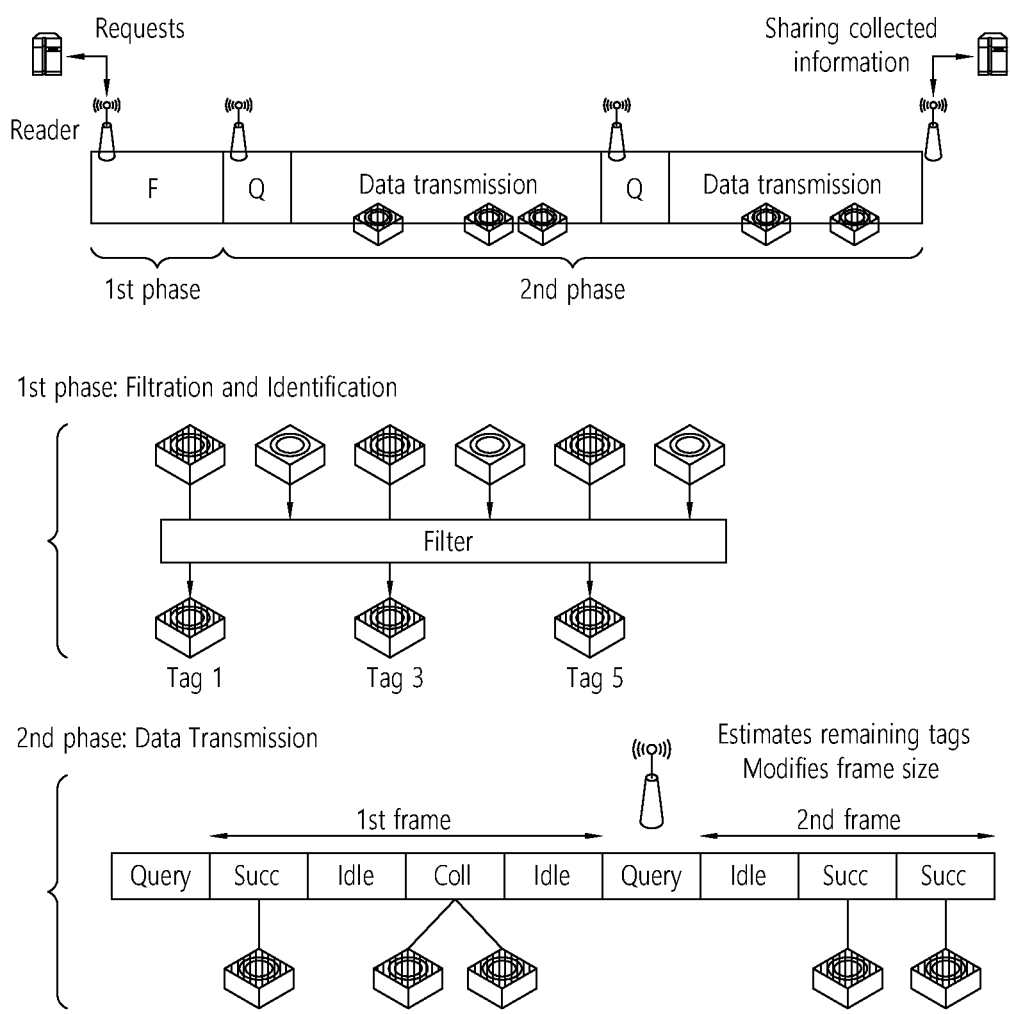
FIG. 7 is a diagram for describing an operation process in a protocol between a tag and a reader according to an embodiment of the present disclosure.

FIG. 7 is a diagram for describing an operation process in a protocol between a tag and a reader according to an embodiment of the present disclosure.

The first phase is an additionally generated phase in the conventional DFSA process, in which the reader 200 generates a filter and the tag determines whether to data through the information of the filter. The IoT management server 300 transmits a unique ID of the tag intended to collect by the reader and information of the total number of tags in a network, and the reader 200 generates the filter based on the corresponding information. The reader 200 broadcasts the number of hash functions used for generating the filter, a random-number generation seed value and the filter including the length information of the filter to the tags. The tag determines whether to transmit and receive data based on the received information.

The tags that pass through the data filter in the first phase participate in a contention for data transmission in the second phase. As an example, tag 1, tag 3 and tag 5 are tags that pass through the filter in the first phase, and tag 2, tag 4 and tag 6 are tags that fail to pass through the filter in the first phase. The tags that fail to pass through the filter harvest energy through the signal sent by the reader 200 in the second phase. In the second phase, the tag transmits data to the reader 200 through a communication of the conventional DFSA scheme. The reader 200 may determine the total number of tags in a network received from the IoT management server 300 and a size of a first frame identically in the first phase. The reader 200 may determine a size of a next frame based on the number of slots in which collision occurs in a previous frame.

Figure 8:
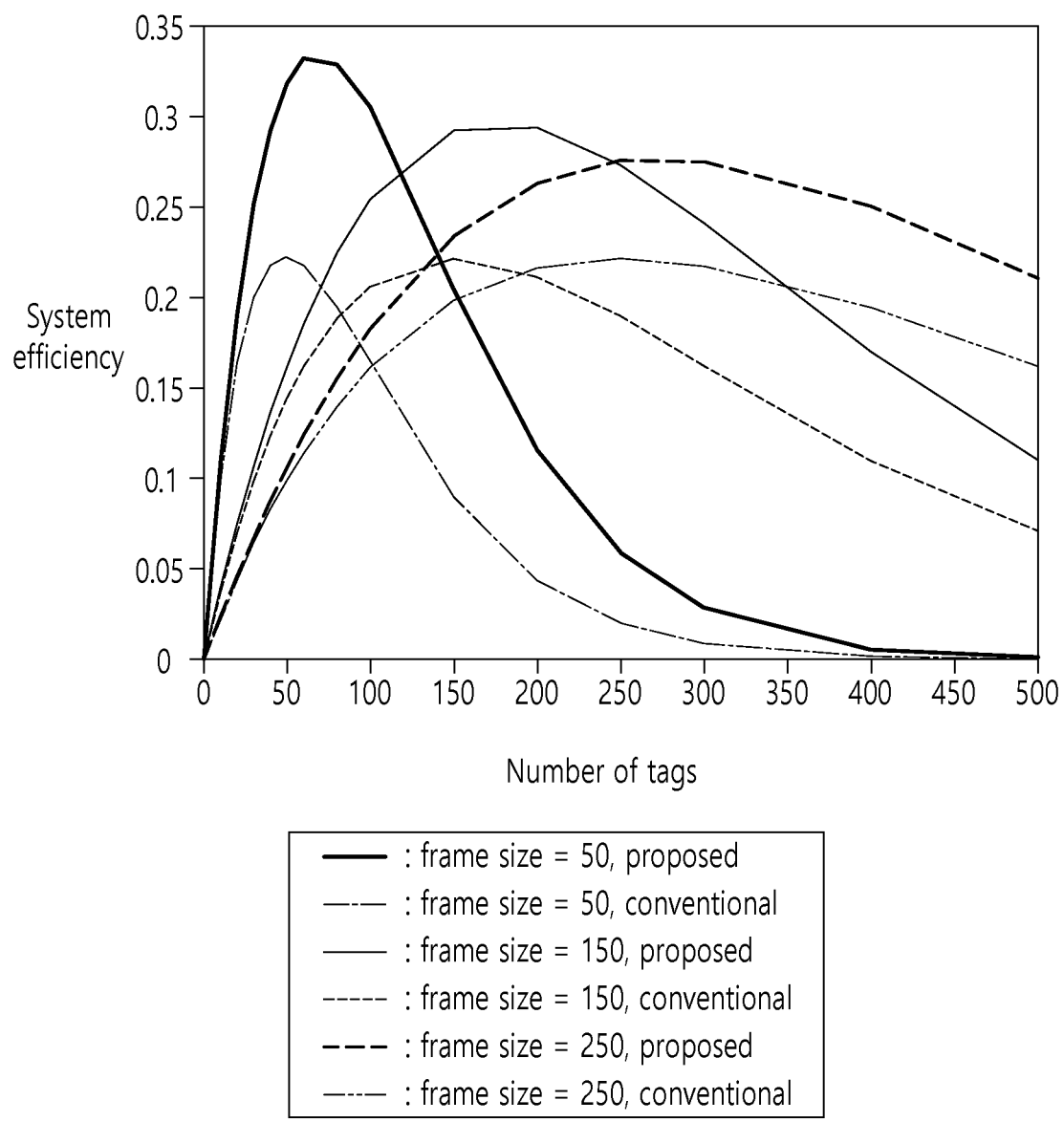
FIG. 8 is a diagram for describing a system efficiency performance according to the number of tags in the conventional art and an embodiment of the present disclosure.

FIG. 8 is a diagram for describing a system efficiency performance according to the number of tags in the conventional art and an embodiment of the present disclosure.

To evaluate the performance of the conventional art (conventional) and an embodiment of the present disclosure (proposed), a system efficiency and a data throughput performance are compared through a simulation. The system efficiency means the number of tags that succeed in a transmission in the first frame among the tags that attempt to collect data, shows good performance as the value increases. The data throughput means the number of total slots that pass until all tags succeed in a transmission and shows good performance as the value decreases. The conventional scheme includes only the second phase in which the reader collects data of all tags without the first phase which is proposed in an embodiment of the present disclosure.

FIG. 8 is a graph showing a system efficiency performance according to the number of tags when a size of the first frame is changed to 50, 150 and 250. When the number of tags is smaller than the size of the first frame, since the channel use rate increases as the number of tags becomes greater, the system efficiency is improved. However, in the case that the number of tags becomes greater than the size of the first frame, since the probability that collision occurs increases as the number of tags becomes greater, the system efficiency is degraded. In an embodiment of the present disclosure, the number of tags that attempt a contention in the first frame becomes smaller than the conventional scheme by using the filter, the maximum system efficiency is better. In the conventional scheme, the system efficiency has a maximum value when the total number of tags and the size of the first frame is identical. However, in an embodiment of the present disclosure, since not all tags attempt a transmission, it is identified that the system efficiency has a maximum value when the number of tags that pass through the filter is identical to the size of the first frame.

Figure 9:
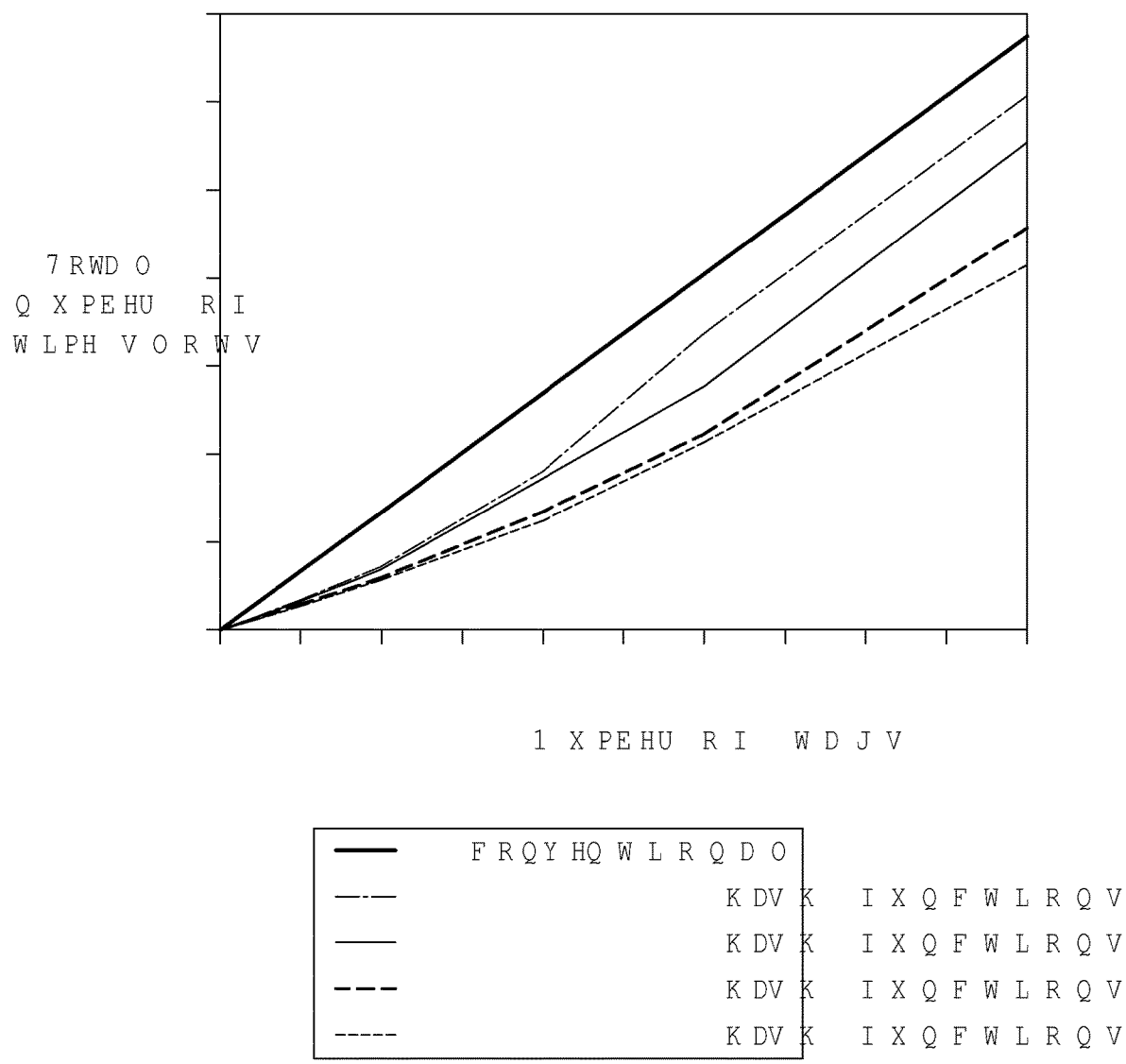
FIG. 9 is a diagram for describing a data throughput performance according to the number of tags in the conventional art and an embodiment of the present disclosure.

FIG. 9 is a diagram for describing a data throughput performance according to the number of tags in the conventional art and an embodiment of the present disclosure.

FIG. 9 is a graph showing a data throughput performance according to the number of tags when a ratio $\phi$ of tag to collect is 0.2 and 0.4, the number of hash functions used for generating a filter is set to 1 (# hash function=1) and 2 (# hash function=2). The data throughput performance is represented by Total number of time slots. In an embodiment of the present disclosure, since the number of tags that participates in a contention for data transmission is decreased by using a filter, it is identified that the data throughput performance is greater than the conventional scheme (conventional). In addition, as the ratio $\phi$ of tag becomes smaller, better performance is output, since a gain becomes greater caused by controlling a plurality of unwanted tags from participating in data transmission contention through a filter. In the case of having the same ratio of $\phi$ tag value, better performance is output, since malfunction probability of the filter becomes decreased when two hash functions are used rather than one hash function is used for generating the filter.

An embodiment of the present disclosure may be applied to the scenario in which the information required in a network including various types of massive IoT devices is quickly collected and applied to the scenario in which a network including UEs that requires low power operation is permanently maintained since UEs that do not participate in data transmission may harvest energy.

Meanwhile, an embodiment of the present disclosure relates to a method for a reader to collect only data of a specific CRFID tag wanted by an IoT management server through a filter using hash function in a massive Internet of Things (IoT) environment including a Computational RFID (CRFID) tag to which a computation function is added to a Radio Frequency identification (RFID) tag. Hereinafter, with reference to FIG. 10 to FIG. 13, it is described a selective communication method between a tag and a reader using a filter according to an embodiment of the present disclosure.

Figure 10:
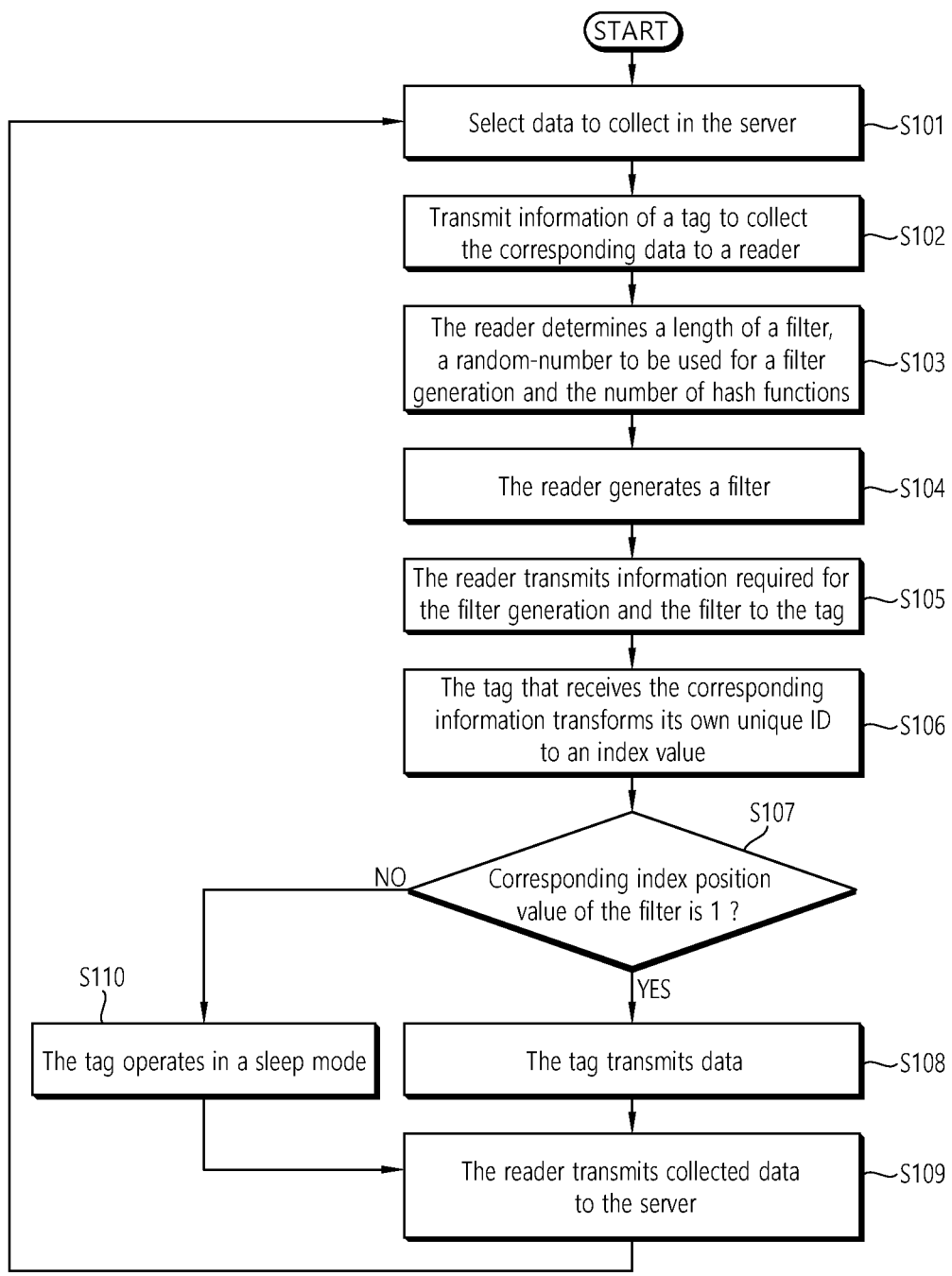
FIG. 10 is a diagram for describing a selective communication method between a tag and a reader using a filter according to an embodiment of the present disclosure.

FIG. 10 is a diagram for describing a selective communication method between a tag and a reader using a filter according to an embodiment of the present disclosure.

In step S101, the server 300 selects data to collect in the server 300.

In step S102, the server 300 transmits information of a tag 100 to collect the corresponding data to a reader 200.

In step S103, the reader 200 determines a length of a filter, a random-number to be used for a filter generation and the number of hash functions.

In step S104, the reader 200 generates a filter based on the determined length of a filter, the random-number to be used for a filter generation and the number of hash functions.

In step S105, the reader 200 transmits information required for the filter generation and the filter to the tag 100.

In step S106, the tag 100 that receives the corresponding information transforms its own unique ID to an index value.

In step S107, the tag 100 checks whether the corresponding index position value of the filter is 1.

In step S108, when the corresponding index position value is 1, the tag transmits the data.

In step S109, the reader 200 transmits the collected data to the server 300.

In step S110, when the corresponding index position value is not 1, the tag 100 operates in a sleep mode.

Figure 11:
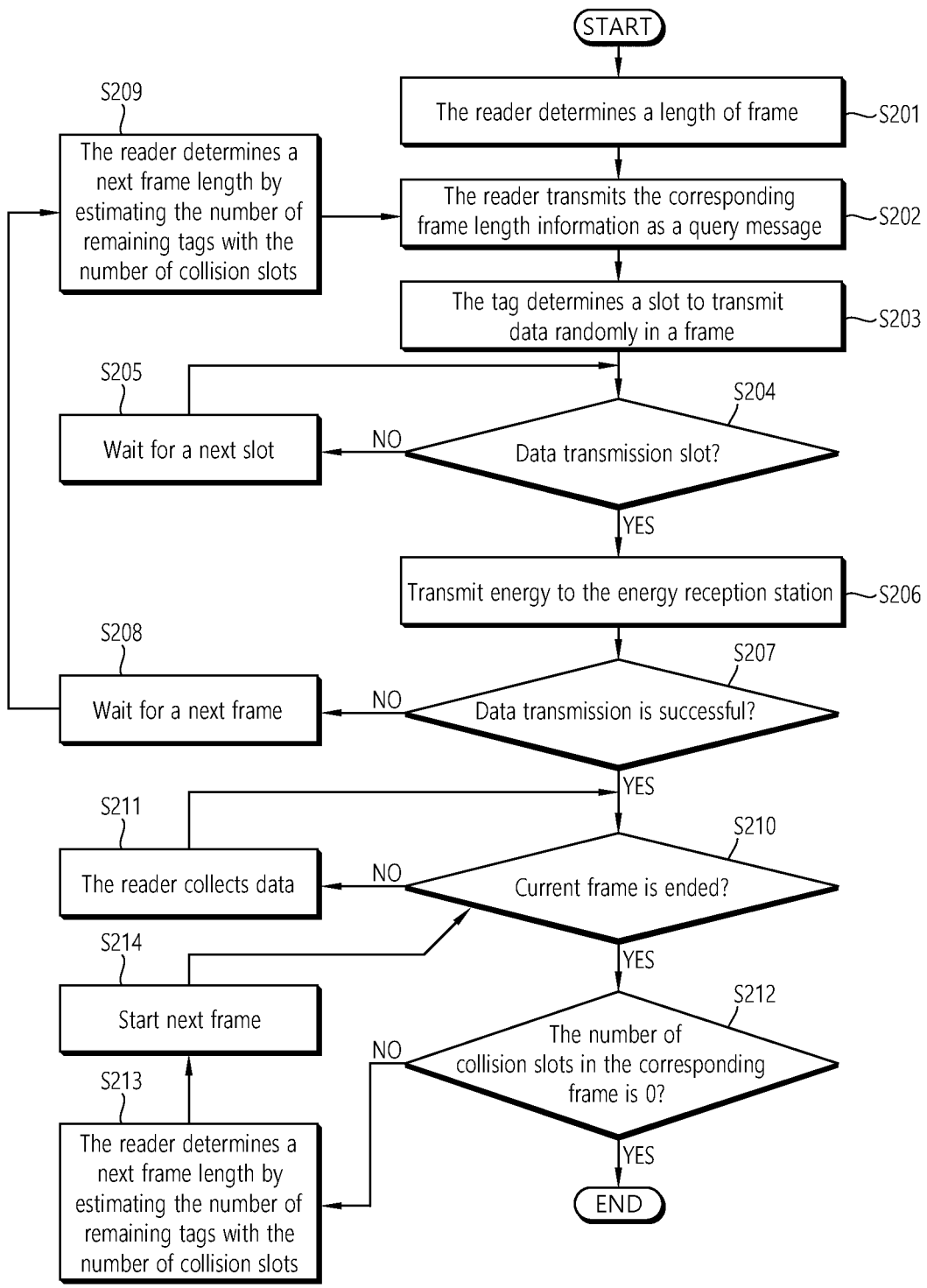
FIG. 11 is a diagram for describing a process of transmitting data in a selective communication method between a tag and a reader according to an embodiment of the present disclosure.

FIG. 11 is a diagram for describing a process of transmitting data in a selective communication method between a tag and a reader according to an embodiment of the present disclosure.

In step S201, the reader 200 determines a length of frame.

In step S202, the reader 200 transmits the corresponding frame length information to the tag 100 as a query message.

In step S203, the tag 100 determines a slot to transmit data randomly in a frame.

In step S204, the tag 100 checks whether the slot is for a data transmission.

In step S205, when the slot is not for a data transmission, the tag 100 waits for a next slot.

In step S206, when the slot is for a data transmission, the tag 100 transmits data.

In step S207, the tag 100 checks whether the data transmission is successful.

In step S208, when the data transmission is not successful, the tag 100 waits for a next frame.

In step S209, the reader 200 determines a next frame length by estimating the number of remaining tags with the number of collision slots after step S208 and performs steps from step S202.

In step S210, when the data transmission is successful, the reader 200 checks whether a current frame is ended.

In step S211, when the current frame is not ended, the reader 200 collects data until the current frame is ended from tag 100.

In step S212, when the current frame is ended, the reader 200 checks whether the number of collision slots in the corresponding frame is 0.

In step S213, when the number of collision slots in the corresponding frame is not 0, the reader 200 determines a next frame length by estimating the number of remaining tags with the number of collision slots.

In step S214, the reader 200 starts a next frame after step S213.

Meanwhile, when the number of collision slots in the corresponding frame is 0, the reader 200 terminates the data transmission process.

Figure 12:
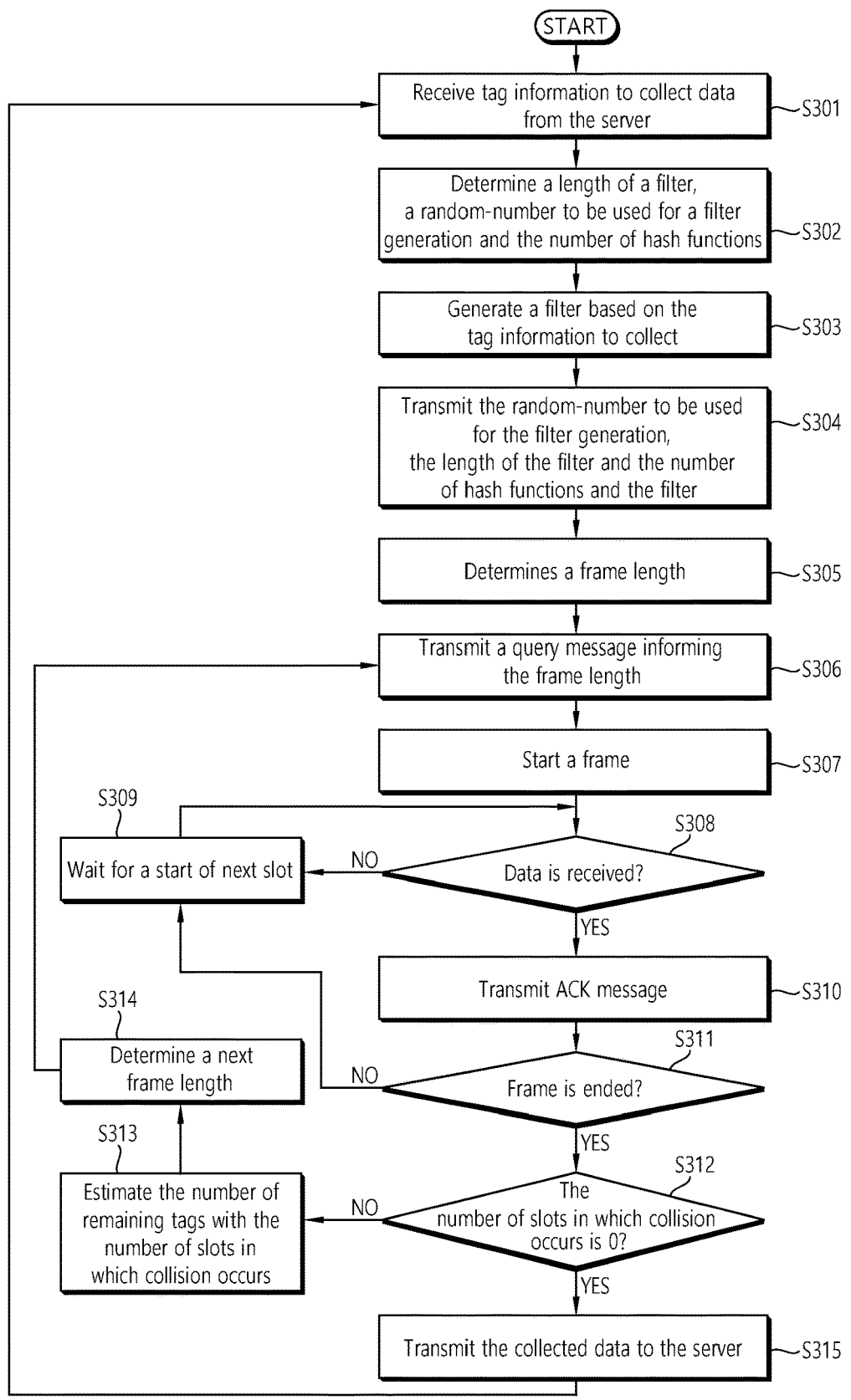
FIG. 12 is a diagram for describing a selective communication method between a tag and a reader using a filter in the reader according to an embodiment of the present disclosure.

FIG. 12 is a diagram for describing a selective communication method between a tag and a reader using a filter in the reader according to an embodiment of the present disclosure.

In step S301, the reader 200 receives tag information to collect data from the server 300.

In step S302, the reader 200 determines a length of a filter, a random-number to be used for a filter generation and the number of hash functions.

In step S303, the reader 200 generates a filter based on the tag information to collect.

In step S304, the reader 200 transmits the filter information used for generating the filter including the random-number to be used for the filter generation, the length of the filter and the number of hash functions and the filter.

In step S305, the reader 200 determines a frame length.

In step S306, the reader 200 transmits a query message informing the frame length.

In step S307, the reader 200 starts a frame.

In step S308, the reader 200 checks whether data is received from the tag 100.

In step S309, when data is not received from the tag 100, the reader 200 waits for a start of next slot.

In step S310, when data is received from the tag 100, the reader 200 transmits ACK message.

In step S311, the reader 200 checks whether the frame is ended.

In step S312, when the frame is not ended, the reader 200 performs step S309, and when the frame is ended, the reader 200 checks whether the number of slots in which collision occurs is 0.

In step S313, when the number of slots in which collision occurs is not 0, the reader 200 estimates the number of remaining tags with the number of slots in which collision occurs.

In step S314, the reader 200 determines a next frame length after step S313.

In step S315, the reader 200 transmits the collected data to the server 300.

Figure 13:
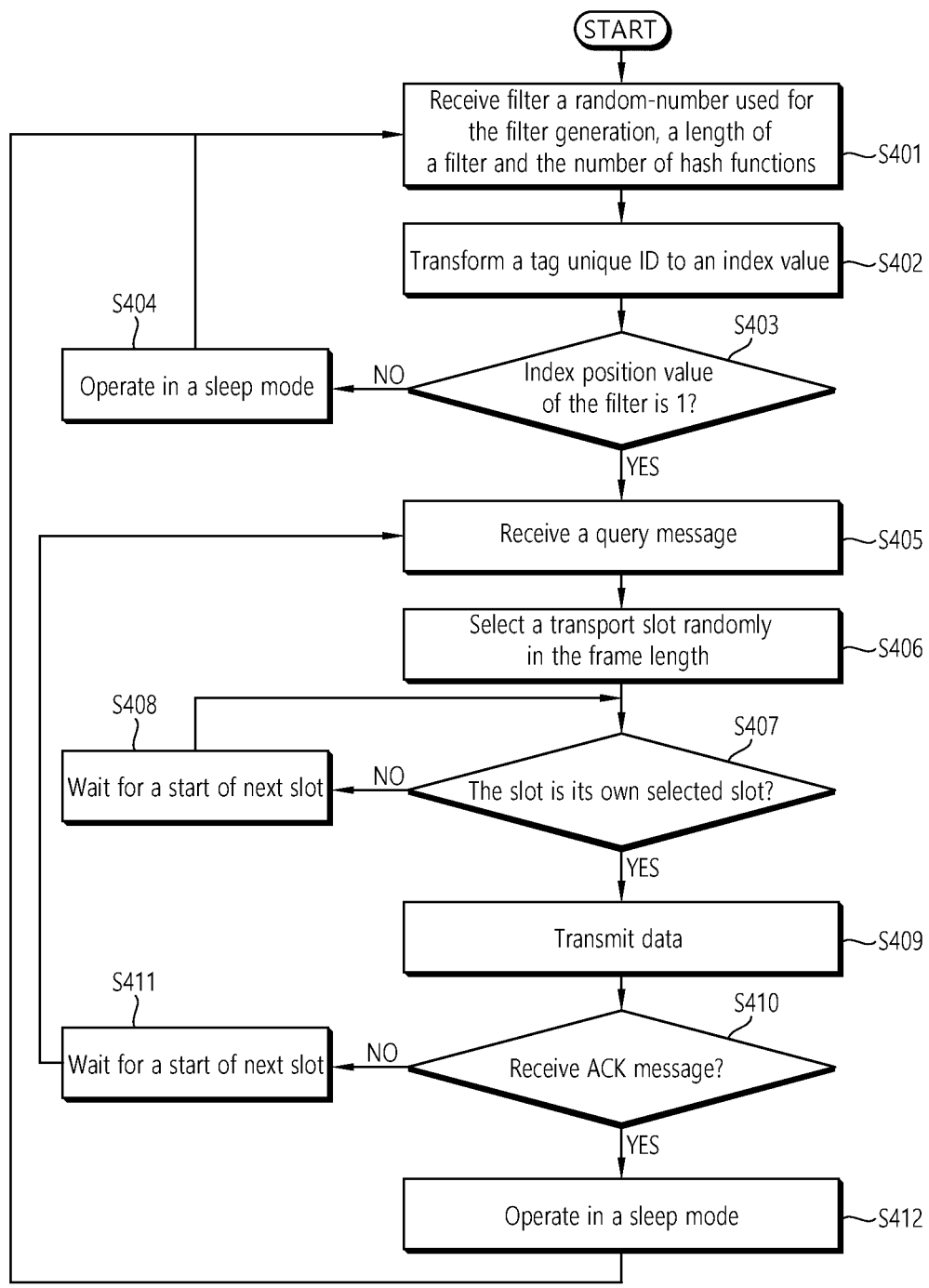
FIG. 13 is a diagram for describing a selective communication method between a tag and a reader using a filter in the tag according to an embodiment of the present disclosure.

FIG. 13 is a diagram for describing a selective communication method between a tag and a reader using a filter in the tag according to an embodiment of the present disclosure.

In step S401, the tag 100 receives filter information used for a filter generation including a random-number used for the filter generation, a length of a filter and the number of hash functions.

In step S402, the tag 100 transforms a tag unique ID to an index value.

In step S403, the tag 100 checks whether an index position value of the filter is 1.

In step S404, when the index position value of the filter is not 1, operates in a sleep mode.

In step S405, when the index position value of the filter is 1, the tag 100 receives a query message.

In step S406, the tag 100 selects a transport slot randomly in the frame length.

In step S407, the tag 100 checks whether the slot is its own selected slot.

In step S408, when the slot is not its own selected slot, the tag 100 waits until a start of next slot.

In step S409, when the slot is its own selected slot, the tag 100 transmits data to the reader 200.

In step S410, the tag 100 checks whether ACK message is received.

In step S411, when the ACK message is not received, the tag 100 waits for a start of next frame and performs step S405.

In step S412, when the ACK message is received, the tag 100 operates in a sleep mode.

Figure 14:
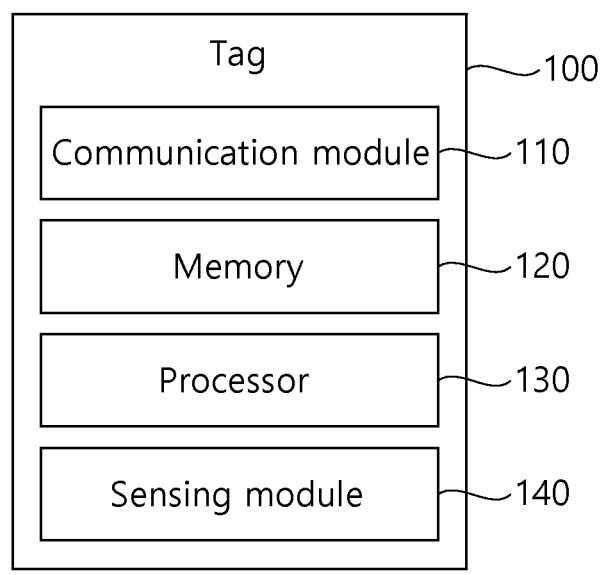
FIG. 14 is a configuration diagram for describing a configuration of a tag performing a selective communication method between a tag and a reader according to an embodiment of the present disclosure.

FIG. 14 is a configuration diagram for describing a configuration of a tag performing a selective communication method between a tag and a reader according to an embodiment of the present disclosure.

As shown in FIG. 14, the tag 100 according to an embodiment of the present disclosure includes a communication module 110, a memory 120, a processor 130 and a sensing module 140. However, not all constituent elements shown in the drawing are essential elements. The tag 100 may be implemented by more constituent elements than the constituent elements shown in the drawing, or the tag 100 may be implemented by less constituent elements than the constituent elements shown in the drawing.

Hereinafter, the detailed configuration and operation of each elements of the tag 100 of FIG. 14 are described.

The sensing module 140 is provided with various types of sensors and senses data through the provided sensors.

The communication module 110 communicates with the reader 200.

The memory 120 stores at least one command.

The processor 130 is connected to the communication module 110, the memory 120 and the sensing module 140. By executing at least one command, the processor 130 receives a filter from the reader 200 through the communication module 110, checks whether to pass through the filter based on the received filter and its own tag ID, and when passing through the filter, transmits data to the reader 200.

According to various embodiments, when failing to pass the received filter, the processor 130 may operate in a sleep mode.

According to various embodiments, the processor 130 may transform its own tag ID to an index value and check whether to pass through the filter according to a position value corresponding to the transformed index value.

According to various embodiments, the processor 130 may transform its own tag ID to an index value and check whether to pass through the filter according to at least one position value corresponding to the transformed at least one index value.

According to various embodiments, the processor 130 may select a transport slot randomly within a frame length and transmit data to the selected transport slot through the communication module 110.

Figure 15:
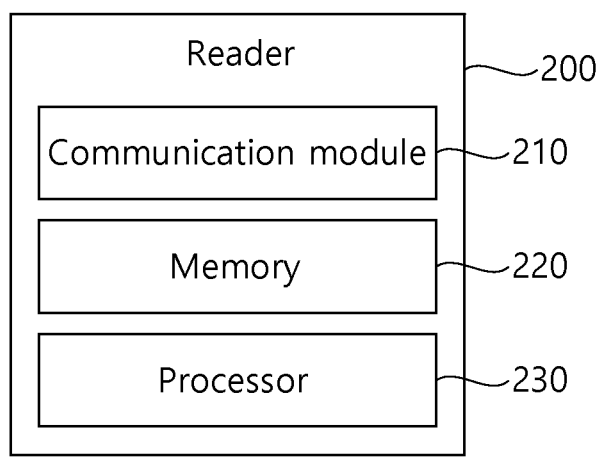
FIG. 15 is a configuration diagram for describing a configuration of a reader performing a selective communication method between a tag and a reader according to an embodiment of the present disclosure.

FIG. 15 is a configuration diagram for describing a configuration of a reader performing a selective communication method between a tag and a reader according to an embodiment of the present disclosure.

As shown in FIG. 15, the reader 200 according to an embodiment of the present disclosure includes a communication module 210, a memory 220 and a processor 230. However, not all constituent elements shown in the drawing are essential elements. The reader 200 may be implemented by more constituent elements than the constituent elements shown in the drawing, or the reader 200 may be implemented by less constituent elements than the constituent elements shown in the drawing.

Hereinafter, the detailed configuration and operation of each elements of the reader 200 of FIG. 15 are described.

The communication module 210 communicates with the tag 100.

The memory 220 stores at least one command.

The processor 230 is connected to the communication module 210 and the memory 220. By executing at least one command, the processor 230 generates a filter based on tag information of a tag to collect data, transmits the generated filter to the tag through the communication module 210 and receives data from a tag that selected through a filtering operation of the transmitted filter.

According to various embodiments, the processor 230 may generate the filter using at least one hash function.

According to various embodiments, the processor 230 may determine filter generation information required for generating the filter based on tag information to collect and generate the filter using the tag information and the determined filter generation information.

According to various embodiments, the processor 230 may determine the filter generation information including a filter length, a random-number generation seed and the number of hash functions.

According to various embodiments, the processor 230 may estimate the number of remaining tags that do not transmit data based on the number of slots in which collision occurs.

The method according to the embodiments of the present disclosure described above may be implemented with codes readable by a computer in a computer-readable recording medium. The method according to the embodiments of the present disclosure may be implemented with a computer program command form which can be executed through various computing means and stored in a computer-readable recording medium.

A computer-readable recording medium in which commands executable by a processor may be provided. When the commands are executed by the processor, the processor is configured to generate a filter based on tag information of a tag to collect data, transmit the generated filter to the tag through the communication module and receive data from a tag that selected through a filtering operation of the transmitted filter.

A computer-readable recording medium in which commands executable by a processor may be provided. When the commands are executed by the processor, the processor is configured to receive a filter from the reader through the communication module, check whether to pass through the filter based on the received filter and its own tag ID, and when passing through the filter, transmits the sensed data to the reader.

The computer-readable recording medium includes all kinds of recording media storing data which can be interpreted by a computer system. For example, the computer-readable recording medium may include a Read Only Memory (ROM), a Random-Access Memory (RAM), a magnetic tape, a magnetic disk, a flash memory, an optical data storage device, and the like. In addition, the computer-readable recording medium may be distributed in computer systems connected to a computer network and may be stored and executed as a code readable in a distribution manner.

In particular, the described features may be implemented within digital electronic circuitry, or computer hardware, firmware, or combinations thereof. The features may be implemented in a computer program product embodied in a storage device in a machine-readable storage device, for example, for execution by a programmable processor. Also, the features may be performed by a programmable processor executing a program of instructions for performing functions of the described embodiments, by operating on input data and generating an output. The described features may be implemented in at least one computer programs that can be executed on a programmable system including at least one programmable processor, at least one input device, and at least one output device which are combined to receive data and directives from a data storage system and to transmit data and directives to the data storage system. A computer program includes a set of directives that can be used directly or indirectly within a computer to perform a particular operation on a certain result. A computer program may be written in any form of programming language including compiled or interpreted languages and may be used in any form included as modules, elements, subroutines, or other units suitable for use in other computer environments or independently operable programs.

Suitable processors for execution of the program of directives include, for example, both general-purpose and special-purpose microprocessors, and a single processor or one of multiple processors of other type of computer. In addition, storage devices suitable for implementing the computer program directives and data implementing the described features include, for example, semiconductor memory devices such as EPROM, EEPROM, and flash memory devices, magnetic devices such as internal hard disks and removable disks, magneto-optical disks, and all forms of nonvolatile memories including CD-ROM and DVD-ROM disks. The processor and memory may be integrated within Application-Specific Integrated Circuits (ASICs) or added by ASICs.

While the present disclosure has been described on the basis of a series of functional blocks, it is not limited by the embodiments described above and the accompanying drawings and it will be apparent to those skilled in the art that various substitutions, modifications and variations can be made without departing from the scope of the present disclosure.

The combination of the above-described embodiments is not limited to the above-described embodiments, and various forms of combination in addition to the above-described embodiments may be provided according to implementation and/or necessity.

In the above-described embodiments, the methods are described on the basis of a flowchart as a series of operations or blocks, but the present disclosure is not limited to the order of the operations, and some operations may occur in different orders or at the same time unlike those described above. It will also be understood by those skilled in the art that the operations shown in the flowchart are not exclusive, and other operations may be included, or one or more operations in the flowchart may be omitted without affecting the scope of the present disclosure.

The above-described embodiments include examples of various aspects. While it is not possible to describe every possible combination for expressing various aspects, one of ordinary skill in the art will recognize that other combinations are possible. Accordingly, it is intended that the present disclosure include all alternatives, modifications and variations that fall within the scope of the following claims.

What is claimed is:

1. A selective communication method between a tag and a reader using a filter performed by a reader, the method comprising:
    generating a filter based on tag information including unique IDs of one or more tags to collect data;
    transmitting the generated filter to the one or more tags; and
    receiving data from a tag selected through a filtering operation of the transmitted filter,
    wherein the filtering operation is performed according to at least one position value corresponding to at least one index value transformed from a unique ID of the tag in the transmitted filter.

2. The selective communication method of claim 1, wherein the generating of the filter includes:
    generating the filter using at least one hash function.

3. The selective communication method of claim 1, wherein the generating of the filter includes:
    determining filter generation information required for generating the filter based on the tag information to collect data, and generating the filter using the tag information and the determined filter generation information.

4. The selective communication method of claim 3, wherein the generating of the filter includes:
    determining the filter generation information including a filter length, a random-number generation seed and a number of hash functions.

5. The selective communication method of claim 1, wherein the receiving of the data includes:
    estimating a number of remaining tags that do not transmit data based on a number of slots in which collision occurs.

6. A selective communication method between a tag and a reader using a filter performed by a tag, the method comprising:
    receiving a filter from a reader;
    transforming its own unique ID to an index value and checking whether a tag passes the received filter according to at least one position value corresponding to the transformed at least one index value in the received filter; and
    transmitting data to the reader in response to the tag passing the received filter.

7. The selective communication method of claim 6, further comprising operating the tag in a sleep mode in response to the tag failing to pass the received filter.

8. The selective communication method of claim 6, the transmitting of the data comprises selecting a transport slot randomly within a frame length and transmitting data to the selected transport slot.

9. A reader for a selective communication between a tag and a reader using a filter, comprising:
    a communication module comprising a transmitter and a receiver configured to communicate with a tag;
    a memory configured to store at least one command;
    a processor connected to the communication module and the memory to execute the at least one command stored in the memory, the processor being configured to:
    generate a filter based on tag information including unique IDs of one or more tags to collect data;
    transmit the generated filter to the one or more tags; and
    receive data from a tag selected through a filtering operation of the transmitted filter,
    wherein the filtering operation is performed according to at least one position value corresponding to at least one index value transformed from a unique ID of the tag in the transmitted filter.

10. The reader of claim 9, wherein the processor is configured to:
    generate the filter using at least one hash function.

11. The reader of claim 9, wherein the processor is configured to:
    determine filter generation information required for generating the filter based on the tag information to collect data; and
    generate the filter using the tag information and the determined filter generation information.

12. The reader of claim 11, wherein the processor is configured to determine the filter generation information including a filter length, a random-number generation seed and a number of hash functions.

13. The reader of claim 9, wherein the processor is configured to estimate a number of remaining tags that do not transmit data based on a number of slots in which collision occurs.

14. A tag for a selective communication between a tag and a reader using a filter, comprising:
    a communication module comprising a transmitter and a receiver configured to communicate with a reader;
    a memory configured to store at least one command;
    a sensing module comprising sensors configured to sense data;
    a processor connected to the communication module, the memory and the sensing module, and configured to:
    receive a filter from a reader;
    transform unique IDs of one or more tags to index values and check whether one or more tags pass the received filter according to at least one position value corresponding to the transformed at least one index value in the received filter; and
    transmit data to the reader in response to the one or more tags passing the received filter.

15. The tag of claim 14, wherein the processor is configured to operate in a sleep mode in response to failing to pass the received filter.

16. The tag of claim 14, wherein the processor is configured to:
    select a transport slot randomly within a frame length; and
    transmit data to the selected transport slot through the communication module comprising the transmitter and the receiver.

* * * * *